United States Patent
Jiang

(10) Patent No.: US 12,500,128 B2
(45) Date of Patent: Dec. 16, 2025

(54) FOUR-TERMINAL RESISTANCE TESTING STRUCTURE

(71) Applicant: Shanghai Huali Integrated Circuit Corporation, Shanghai (CN)

(72) Inventor: Hao Jiang, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 361 days.

(21) Appl. No.: 18/239,844

(22) Filed: Aug. 30, 2023

(65) Prior Publication Data

US 2024/0379472 A1     Nov. 14, 2024

(30) Foreign Application Priority Data

May 10, 2023     (CN) .......................... 202310525576.9

(51) Int. Cl.
    *H01L 21/66*     (2006.01)

(52) U.S. Cl.
    CPC .............. *H01L 22/34* (2013.01); *H01L 22/32* (2013.01)

(58) Field of Classification Search
    CPC ......... H01L 22/34; H01L 22/32; H01L 22/14; G01R 27/08
    See application file for complete search history.

(56) References Cited

U.S. PATENT DOCUMENTS

| | | | | |
|---|---|---|---|---|
| 7,902,852 B1* | 3/2011 | Hess | .................. | G01R 31/2884 |
| | | | | 324/762.01 |
| 8,659,349 B1* | 2/2014 | Lyden | ................ | G01N 27/3273 |
| | | | | 327/563 |
| 2008/0278182 A1* | 11/2008 | Agarwal | ............ | G01R 31/2884 |
| | | | | 257/E21.531 |
| 2009/0256149 A1* | 10/2009 | Ho | .......................... | H01L 22/34 |
| | | | | 438/18 |

* cited by examiner

*Primary Examiner* — Thanh T Nguyen
(74) *Attorney, Agent, or Firm* — Banner & Witcoff, Ltd.

(57) ABSTRACT

The present application discloses a four-terminal resistance testing structure. A test key includes a resistor string formed by connecting two or more tested resistors in series. Two ends of each tested resistor are respectively provided with one first pad. At least one of the two first pads of each tested resistor is shared as the first pad of an adjacent tested resistor. Each tested resistor includes two force terminals and two sense terminals. The two force terminals are formed by the first pads at the two ends of the tested resistor, and each of the two sense terminals is composed of a pad located at a position adjacent to the corresponding force terminal. The present application can reduce the number of pads and thus save the area on the premise of ensuring the measurement accuracy.

16 Claims, 1 Drawing Sheet

FOUR-TERMINAL RESISTANCE TESTING STRUCTURE

CROSS-REFERENCE TO RELATED APPLICATIONS

This application claims the priority to Chinese patent application No. 202310525576.9 filed on May 10, 2023, the disclosure of which is incorporated herein by reference in its entirety.

TECHNICAL FIELD

The present application relates to the field of semiconductor integrated circuit manufacturing, in particular to a four-terminal resistance testing structure.

BACKGROUND

Referring to FIG. 1, it illustrates a circuit diagram of an existing two-terminal resistance testing structure. Each of two ends of a tested resistor 101 is provided with one pad, and the two pads are respectively marked as 102a and 102b. The pad 102a is used as a positive force (F) terminal, and the pad 102b is used as a negative force terminal. In FIG. 1, the positive force terminal is also represented by F+ Pad, and the negative force terminal is also represented by F− Pad. F+ represents positive force, and F− represents negative force. Due to the influence of parasitic series resistance, the existing two-terminal resistance testing will result in inaccurate resistance.

Four-terminal resistance measurement can effectively avoid the influence of parasitic series resistance and obtain accurate measured resistance values. Referring to FIG. 2, it illustrates a circuit diagram of an existing four-terminal resistance testing structure. Two pads need to be connected to each end of a tested resistor 201, and totally four pads are needed. The four pads are respectively marked as 202a, 202b, 202c and 202d. The pad 202a is used as F+ pad, the pad 102b is used as F− pad, the pad 202c is used as a positive sense(S) terminal, and the pad 202d is used as a negative sense terminal. The positive sense terminal is also represented by S+ Pad, the negative sense terminal is also represented by S− Pad, S+ represents positive sense, and S− represents negative sense.

In semiconductor wafer resistance testing, the existing four-terminal resistance measurement illustrated in FIG. 2 requires each resistor structure to occupy four metal layer pads, i.e., F+/F−/S+/S−. Compared with the two-terminal method, it requires more pads and occupies more wafer area.

In actual applications, in order to comprehensively consider the testing accuracy and the area occupied by the structure, it is often the case that both the four-terminal structure and the two-terminal structure exist simultaneously.

Referring to FIG. 2, specific configurations for the existing four-terminal testing include the follows:

Force current or voltage is applied to F+ Pad, i.e., pad 202, and the current on F+ Pad is recorded or measured as Iforce.

F− Pad, i.e., pad 202b is grounded or forced to zero voltage.

S+ Pad, i.e., pad 202c, and S− Pad, i.e., pad 202a are forced to zero current and voltages are measured simultaneously, and are respectively recorded as VsenseP and VsenseN.

The resistance value measured by adopting the four-terminal method is R=(VsenseP−VsenseN)/Iforce.

Since the voltage measured by the four-terminal method is obtained by the difference between the sense terminals and the current on the sense terminals is zero, there is no voltage drop caused by parasitic resistance in Vsense. Therefore, it is possible to obtain very accurate voltage values at two ends of the resistor and calculate the accurate resistance value.

The biggest drawback of the four-terminal method is that each resistor structure occupies four pads, which greatly consumes the area of the testing structure.

BRIEF SUMMARY

According to some embodiments in this application, a four-terminal resistance testing structure provided by the present application includes a plurality of test keys. Each test key includes:

a resistor string formed by connecting two or more tested resistors in series, the resistor string including a plurality of pads, the pads including first pads;

each of two ends of each tested resistor being provided with one first pad, at least one of the two first pads of each tested resistor being shared as the first pad of an adjacent tested resistor;

each tested resistor including two force terminals and two sense terminals, the two force terminals being formed by the first pads at the two ends of the tested resistor, each of the two sense terminals being composed of a pad located at a position adjacent to the corresponding force terminal;

in a case that the first pad corresponding to a selected force terminal of a selected tested resistor is shared with an adjacent tested resistor, a selected sense terminal of the selected tested resistor adjacent to the selected force terminal being composed of the first pad at the other end of the adjacent tested resistor.

In some cases, the pads further include a second pad and a third pad;

the tested resistors located at two ends of the resistor string are respectively a first tested resistor and a last tested resistor; a first end of the first tested resistor is further provided with one second pad, and a second end of the last tested resistor is further provided with one third pad.

In some cases, in a case that the selected tested resistor is the first tested resistor, the sense terminal at the first end of the selected tested resistor is composed of the second pad.

In some cases, in a case that the selected tested resistor is the last tested resistor, the sense terminal at the second end of the selected tested resistor is composed of the third pad.

In some cases, the tested resistors located at two ends of the resistor string are respectively a first tested resistor and a last tested resistor; the resistor string is in a ring structure; the first pad at a first end of the first tested resistor is shared as the first pad at a second end of the last tested resistor; in the ring structure of the resistor string, the number of the tested resistors is more than 4, and the number of the first pads is equal to the number of the tested resistors.

In some cases, the second pad is connected to the adjacent first pad through a metal wire.

In some cases, the third pad is connected to the adjacent first pad through a metal wire.

In some cases, the four-terminal resistance testing structure is formed on a semiconductor wafer.

In some cases, the four-terminal resistance testing structure is located in a dicing path of the semiconductor wafer.

In some cases, the semiconductor wafer includes a silicon wafer.

In some cases, the two first pads of each tested resistor are both respectively shared as the first pads of the adjacent tested resistors.

In some cases, when each tested resistor is measured, the two force terminals are used for applying force current or voltage and recording or measuring current, and the two sense terminals are used for measuring voltage.

In some cases, the force current is constant source current.

In some cases, the four-terminal resistance testing structure is used as a resistance testing structure in Wafer Acceptance Testing (WAT), Simulation Program with Integrated Circuit Emphasis (SPICE), or reliability testing.

In some cases, the maximum number of the tested resistors in the test key is tens or more.

In some cases, the maximum number of the test keys in the four-terminal resistance testing structure is tens or more.

Different from the existing technology in which each tested resistor needs four separate pads to serve as four test terminals, in the present application, the tested resistors are connected in series to form a series structure, each of two ends of each tested resistor is provided with one first pad, and at least one of the first pads is shared with an adjacent tested resistor. Each tested resistor still has four test terminals in actual testing. The first pads at two ends of the tested resistor serve as force terminals. The first pad of a tested resistor adjacent to each force terminal can be used as a sense terminal. During testing, the current on the sense terminals tends to 0 A, so adding an adjacent tested resistor to the sense terminal and the force terminal does not influence the voltage test result. However, it can achieve the sharing of the first pad between different tested resistors, thus greatly reducing the number of pads in the entire test key. Therefore, the present application can reduce the number of pads and thus save the area on the premise of not influencing the accuracy of the test result.

BRIEF DESCRIPTION OF THE DRAWINGS

The present application will be further described below in detail in combination with the specific embodiments with reference to the drawings.

DETAILED DESCRIPTION OF THE APPLICATION

Figure 3:
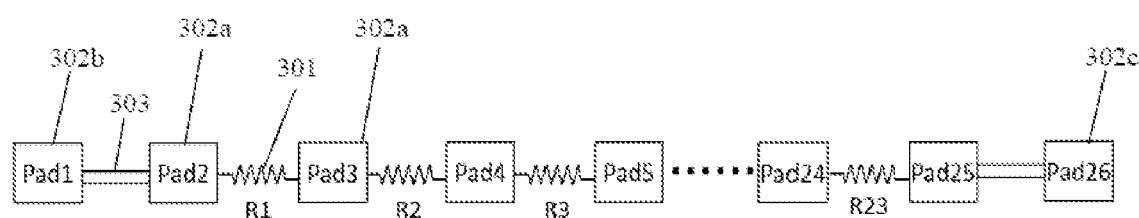
FIG. 3 illustrates a circuit diagram of a four-terminal resistance testing structure according to an embodiment of the present application.

Referring to FIG. 3, it illustrates a circuit diagram of a four-terminal resistance testing structure according to an embodiment of the present application. The four-terminal resistance testing structure according to the embodiment of the present application includes a plurality of test keys. FIG. 3 illustrates a circuit diagram of one test key. Each test key includes:

a resistor string formed by connecting two or more tested resistors in series. The resistor string includes a plurality of pads. The pads include first pads 302a. The number of the tested resistors 301 illustrated in FIG. 3 is 23. The tested resistors 301 are further marked as R1, R2, R3 to R23, respectively. The number of the first pads 302a is 24. The first pads 302a are further marked as Pad2, Pad3, Pad4, Pad5 to Pad24, and Pad25, respectively.

Each of two ends of each tested resistor 301 is provided with one first pad 302a. At least one of the two first pads 302a of each tested resistor 301 is shared as the first pad 302a of an adjacent tested resistor 301. That is, two shared first pads 302a are merged into one first pad 302a.

In the embodiments of the present application, the two first pads 302a of each tested resistor 301 are respectively shared as the first pads 302a of adjacent tested resistors 301. In other embodiments, on the premise that one of the two first pads 302a of each tested resistor 301 is shared as the first pad 302a of an adjacent tested resistor 301, the other of the two first pads 302a of the tested resistor 301 may be directly connected to the first pad 302a of an adjacent tested resistor 301 through a metal wire 303. For example, in FIG. 3, R2 is replaced with a metal wire 303. Compared with the existing technology, this situation can also reduce the number of pads. However, in a case that the two first pads 302a of each tested resistor 301 are both respectively shared as the first pads 302a of adjacent tested resistors 301, the number of pads can be reduced more greatly, which is more conducive to saving the area.

Each tested resistor 301 includes two force terminals and two sense terminals. The two force terminals are formed by the first pads 302a at the two ends of the tested resistor 301. Each of the two sense terminals is composed of a pad located at a position adjacent to the corresponding force terminal.

In a case that the first pad 302a corresponding to a selected force terminal of a selected tested resistor 301 is shared with an adjacent tested resistor 301, a selected sense terminal of the selected tested resistor 301 adjacent to the selected force terminal is composed of the first pad 302a at the other end of the adjacent tested resistor 301. In FIG. 3, taking R2 being the selected tested resistor 301 as an example, Pad3 and Pad4 are two force terminals, i.e., F terminals, such as F+ Pad and F− Pad, respectively. The first pad 302a adjacent to Pad3 is Pad2, and the first pad 302a adjacent to Pad4 is Pad5. Therefore, Pad2 and Pad5 are used as two sense terminals, such as S+ Pad and S− Pad, respectively. Since the current on S+ Pad and S− Pad during resistance measurement is zero, that is, they are forced to zero current, regardless of the size of R1 and R3, the voltage drops on R1 and R3 can be ignored when measuring R2. Therefore, accurate measured voltage values can be obtained through Pad2 and Pad5, and ultimately R2 can be measured through Pad2 to Pad5. However, Pad2 to Pad5 are not provided for R2 only, but can be applied to the plurality of tested resistors 301 to achieve shared use by the plurality of tested resistors 301 in the measurement process. For example, Pad3 can serve as corresponding ports in the measurement of R1, R2, and R3, thus actually achieving the effect that Pad3 is shared among three tested resistors 301 in the measurement process.

In the embodiment of the present application, the pads further include a second pad 302b and a third pad 302c. In FIG. 3, the second pad 302b is represented by Pad1, and the third pad 302c is represented by Pad26. It can be seen that in FIG. 3, the total number of the pads is 26, and the number of the tested resistors 301 is 23.

The tested resistors 301 located at two ends of the resistor string are respectively a first tested resistor 301 and a last tested resistor 301. A first end of the first tested resistor 301 is further provided with one second pad 302b, and a second end of the last tested resistor 301 is further provided with one third pad 302c. The second pad 302b is connected to the adjacent first pad 302a through a metal wire 303. The third pad 302c is connected to the adjacent first pad 302a through a metal wire 303. In a case that the selected tested resistor 301 is the first tested resistor 301, i.e., R1, the sense terminal at the first end of the selected tested resistor 301 is composed of the second pad 302b. In a case that the selected tested resistor 301 is the last tested resistor 301, i.e., R23, the sense terminal at the second end of the selected tested resistor 301 is composed of the third pad 302c.

Figure 1:
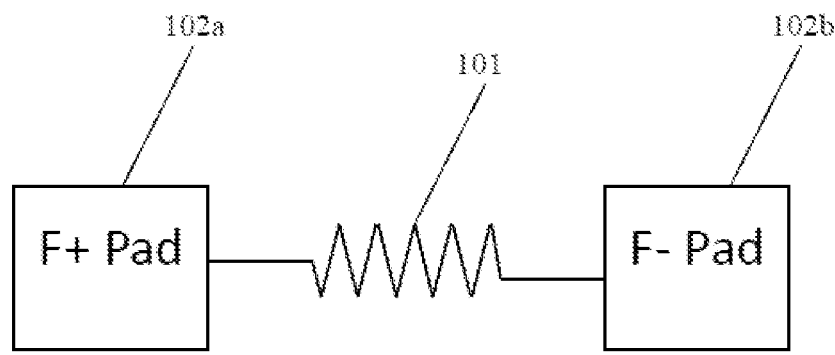
FIG. 1 illustrates a circuit diagram of an existing two-terminal resistance testing structure.
Figure 2:
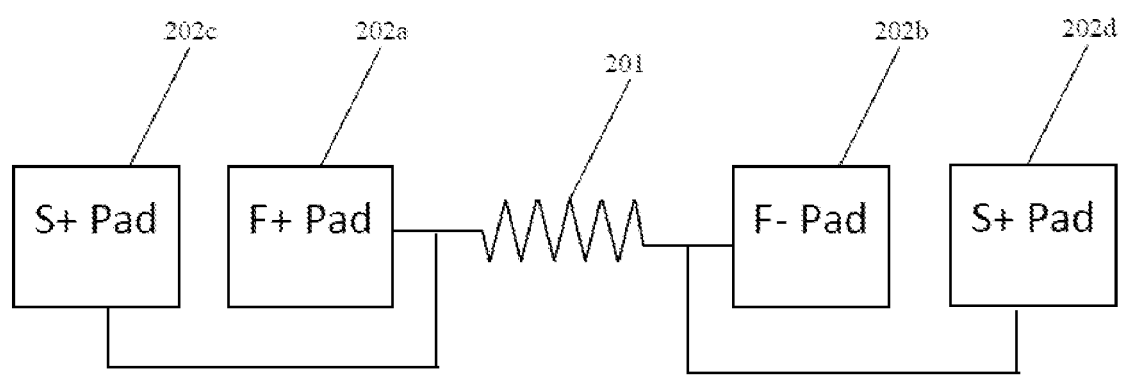
FIG. 2 illustrates a circuit diagram of an existing four-terminal resistance testing structure.

From FIG. 3, it can be seen that, in the embodiment of the present application, 25 pads can realize the measurement of 23 tested resistors 301. However, in a case that the existing structure illustrated in FIG. 2 is adopted, dividing 25 by 4 can only obtain six resistance testing structures illustrated in FIG. 2, which can realize the measurement of only six tested resistors. Therefore, the embodiment of the present application can increase the number of tested resistors under the situation of the same number of pads and can greatly reduce the number of pads under the situation of the same number of tested resistors.

In other embodiments, the tested resistors 301 located at two ends of the resistor string are respectively a first tested resistor 301 and a last tested resistor 301; the resistor string is in a ring structure; the first pad 302a at a first end of the first tested resistor 301 is shared as the first pad 302a at a second end of the last tested resistor 301. In the ring structure of the resistor string, the number of the tested resistors 301 is more than 4, and the number of the first pads 302a is equal to the number of the tested resistors 301. That is to say, on the premise that there are at least four first pads 302a, each tested resistor 301 can obtain four test terminals, i.e., two force terminals and two sense terminals. That is, based on FIG. 3, Pad2 and Pad25 are directly shared. After shared, Pad2 and Pad25 are transformed from two pads to one pad, while Pad1 and Pad26 are omitted. Finally, only 23 pads are needed, thus achieving the minimization of the number of pads. That is, only 23 pads are needed for 23 tested resistors 301. On average, only one pad is needed for one tested resistor 301.

In the embodiment of the present application, the four-terminal resistance testing structure is formed on a semiconductor wafer.

The four-terminal resistance testing structure is located in a dicing path of the semiconductor wafer.

The semiconductor wafer includes a silicon wafer.

When each tested resistor 301 is measured, the two force terminals are used for applying force current or voltage and recording or measuring current, and the two sense terminals are used for measuring voltage.

The force current is constant source current.

The four-terminal resistance testing structure is used as a resistance testing structure in wafer acceptance testing, SPICE, or reliability testing.

The maximum number of the tested resistors 301 in the test key is tens or more.

The maximum number of the test keys in the four-terminal resistance testing structure is tens or more.

Different from the existing technology in which each tested resistor 301 needs four separate pads to serve as four test terminals, in the embodiment of the present application, the tested resistors 301 are connected in series to form a series structure, each of two end of each tested resistor 301 is provided with one first pad 302a, and at least one of the first pads 302a is shared with an adjacent tested resistor 301. Each tested resistor 301 still has four test terminals in actual testing. The first pads 302a at two ends of the tested resistor 301 serve as force terminals. The first pad 302a of a tested resistor adjacent to each force terminal can be used as a sense terminal. During testing, the current on the sense terminals tends to 0 A, so adding an adjacent tested resistor to the sense terminal and the force terminal does not influence the voltage test result. That is, the tested resistor 301 added to the sense terminal and the force terminal is equivalent to a part of a sense terminal lead. By utilizing the characteristic of zero current on the sense terminal, the resistance of the sense terminal lead can be completely ignored. Therefore, it can finally achieve the sharing of the first pad 302a between different tested resistors 301, thus greatly reducing the number of pads in the entire test key. Therefore, the present application can reduce the number of pads and thus save the area on the premise of not influencing the accuracy of the test result.

For the testing of the resistor structure in the semiconductor wafer technology, including but not limited to WAT, SPICE, and reliability testing, the design of the four-terminal resistance testing structure in the embodiment of the present application can effectively save the total area occupied by the testing structure. Taking the reliability Stress Migration (SM) testing structure as an example, generally the number of SM resistor structures may reach up to thousands, and the number of occupied test keys is about 200. In the embodiment of the present application, the number of needed test keys is only about 50, thus effectively reducing the structural area.

The present application has been described above in detail through the specific embodiments, which, however, do not constitute limitations to the present application. Without departing from the principle of the present application, those skilled in the art may make many modifications and improvements, which should also be considered as included in the scope of protection of the present application.

What is claimed is:

1. A four-terminal resistance testing structure, comprising a plurality of test keys, each test key comprising:
   a resistor string formed by connecting two or more tested resistors in series, the resistor string comprising a plurality of pads, the pads comprising first pads;
   each of two ends of each tested resistor being provided with one first pad, at least one of the two first pads of each tested resistor being shared as the first pad of an adjacent tested resistor;
   each tested resistor comprising two force terminals and two sense terminals, the two force terminals being formed by the first pads at the two ends of the tested resistor, each of the two sense terminals being composed of a pad located at a position adjacent to the corresponding force terminal;
   in a case that the first pad corresponding to a selected force terminal of a selected tested resistor is shared with an adjacent tested resistor, a selected sense terminal of the selected tested resistor adjacent to the selected force terminal being composed of the first pad at the other end of the adjacent tested resistor.

2. The four-terminal resistance testing structure according to claim 1, wherein the pads further comprise a second pad and a third pad;
   the tested resistors located at two ends of the resistor string are respectively a first tested resistor and a last tested resistor; a first end of the first tested resistor is further provided with one second pad, and a second end of the last tested resistor is further provided with one third pad.

3. The four-terminal resistance testing structure according to claim 2, wherein in a case that the selected tested resistor is the first tested resistor, the sense terminal at the first end of the selected tested resistor is composed of the second pad.

4. The four-terminal resistance testing structure according to claim 2, wherein in a case that the selected tested resistor is the last tested resistor, the sense terminal at the second end of the selected tested resistor is composed of the third pad.

5. The four-terminal resistance testing structure according to claim 2, wherein the second pad is connected to the adjacent first pad through a metal wire.

6. The four-terminal resistance testing structure according to claim 2, wherein the third pad is connected to the adjacent first pad through a metal wire.

7. The four-terminal resistance testing structure according to claim 1, wherein the tested resistors located at two ends of the resistor string are respectively a first tested resistor and a last tested resistor; the resistor string is in a ring structure; the first pad at a first end of the first tested resistor is shared as the first pad at a second end of the last tested resistor; in the ring structure of the resistor string, the number of the tested resistors is more than four, and the number of the first pads is equal to the number of the tested resistors.

8. The four-terminal resistance testing structure according to claim 1, wherein the four-terminal resistance testing structure is formed on a semiconductor wafer.

9. The four-terminal resistance testing structure according to claim 8, wherein the four-terminal resistance testing structure is located in a dicing path of the semiconductor wafer.

10. The four-terminal resistance testing structure according to claim 8, wherein the semiconductor wafer comprises a silicon wafer.

11. The four-terminal resistance testing structure according to claim 1, wherein the two first pads of each tested resistor are both respectively shared as the first pads of the adjacent tested resistors.

12. The four-terminal resistance testing structure according to claim 1, wherein when each tested resistor is measured, the two force terminals are used for applying force current or voltage and recording or measuring current, and the two sense terminals are used for measuring voltage.

13. The four-terminal resistance testing structure according to claim 12, wherein the force current is constant source current.

14. The four-terminal resistance testing structure according to claim 1, wherein the four-terminal resistance testing structure is used as a resistance testing structure in wafer acceptance testing, Simulation Program with Integrated Circuit Emphasis (SPICE), or reliability testing.

15. The four-terminal resistance testing structure according to claim 14, wherein the maximum number of the tested resistors in the test key is tens or more.

16. The four-terminal resistance testing structure according to claim 14, wherein the maximum number of the test keys in the four-terminal resistance testing structure is tens or more.

* * * * *